United States Patent
Banno

(10) Patent No.: US 9,653,881 B2
(45) Date of Patent: May 16, 2017

(54) METHOD FOR TESTING TUNABLE WAVELENGTH LASER DEVICE AND TUNABLE WAVELENGTH LASER DEVICE

(71) Applicant: Sumitomo Electric Industries, Ltd., Osaka-shi (JP)

(72) Inventor: Eiichi Banno, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/527,699

(22) Filed: Oct. 29, 2014

(65) Prior Publication Data
US 2015/0117478 A1     Apr. 30, 2015

(30) Foreign Application Priority Data
Oct. 30, 2013   (JP) ................. 2013-226020

(51) Int. Cl.
| | |
|---|---|
| H01S 5/06 | (2006.01) |
| H01S 5/00 | (2006.01) |
| H01S 5/026 | (2006.01) |
| H01S 5/0625 | (2006.01) |
| H01S 5/12 | (2006.01) |

(52) U.S. Cl.
CPC .......... *H01S 5/0617* (2013.01); *H01S 5/0014* (2013.01); *H01S 5/0265* (2013.01); *H01S 5/06256* (2013.01); *H01S 5/06258* (2013.01); *H01S 5/1209* (2013.01); *H01S 5/1212* (2013.01)

(58) Field of Classification Search
CPC ............................ H01S 5/0078; H01S 5/0687
See application file for complete search history.

(56) References Cited

U.S. PATENT DOCUMENTS

| | | | |
|---|---|---|---|
| 7,483,453 B2 * | 1/2009 | Diffily | H01S 5/06256 372/18 |
| 2002/0041611 A1 * | 4/2002 | May | 372/29.02 |
| 2002/0181519 A1 * | 12/2002 | Vilhelmsson et al. | 372/32 |
| 2011/0052207 A1 * | 3/2011 | Ishikawa et al. | 398/182 |

FOREIGN PATENT DOCUMENTS

JP     2009-026996 A     2/2009

* cited by examiner

*Primary Examiner* — Joshua King
(74) *Attorney, Agent, or Firm* — Venable LLP; Michael A. Sartori; Laura G. Remus

(57) ABSTRACT

A method for testing a tunable wavelength laser device, which can suppress any error of light transmission characteristics of an etalon, and a tunable wavelength laser device are provided. The method for testing a tunable wavelength laser device is a method for testing a tunable wavelength laser device including a tunable wavelength laser and a wavelength sensing unit having an etalon. The testing method includes a first step of measuring a free spectral range interval of the etalon, a second step of acquiring a driving condition by tuning a wavelength to a target value provided between a top and a bottom of the free spectral range interval, and a third step of storing the driving condition in a memory.

7 Claims, 13 Drawing Sheets

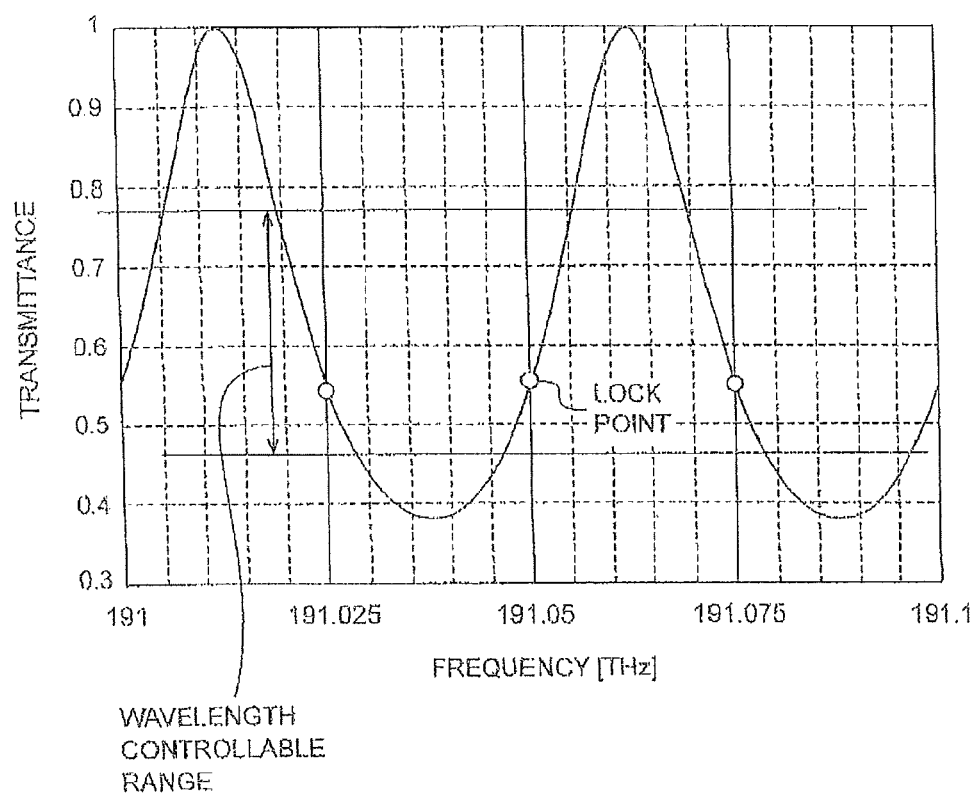

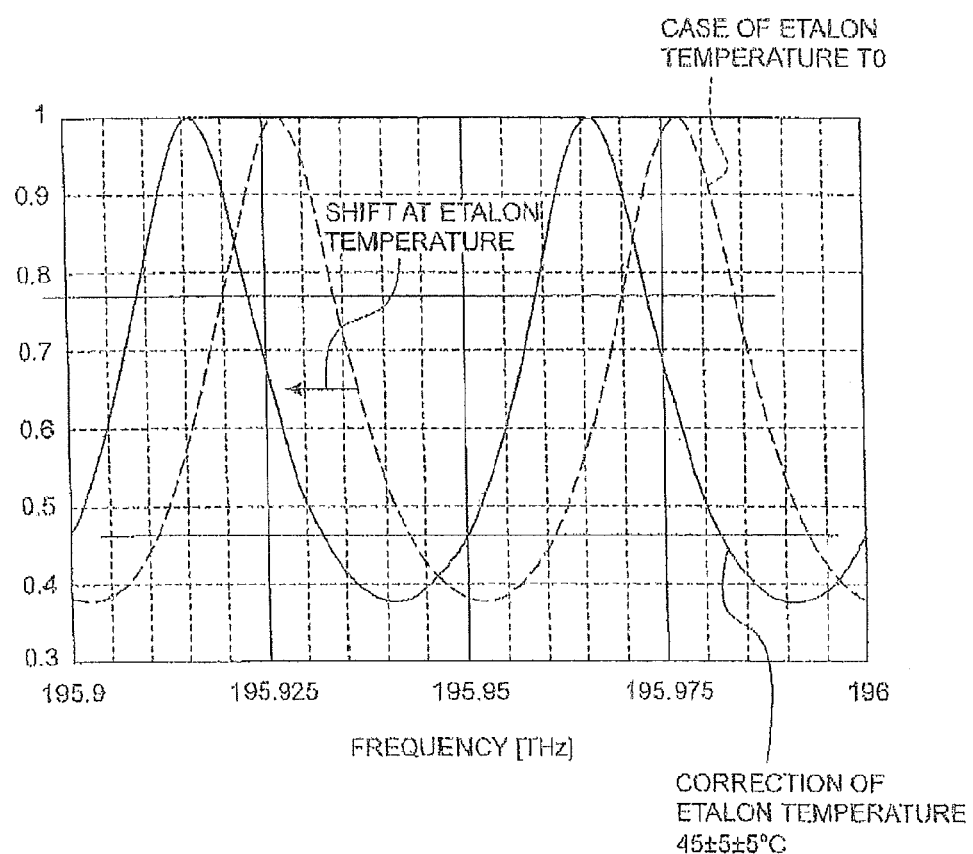

Fig.6

```
                    GRID INTERVAL
        |←─────────────────────────────────→|
        |                  |                 |
        |                  |                 |
        |                  |                 |
        |                  |                 |
        |                  |                 |
    ────┴──────────────────┴─────────────────┴────
    GRID              REQUIRED            GRID
    WAVELENGTH        WAVELENGTH          WAVELENGTH
```

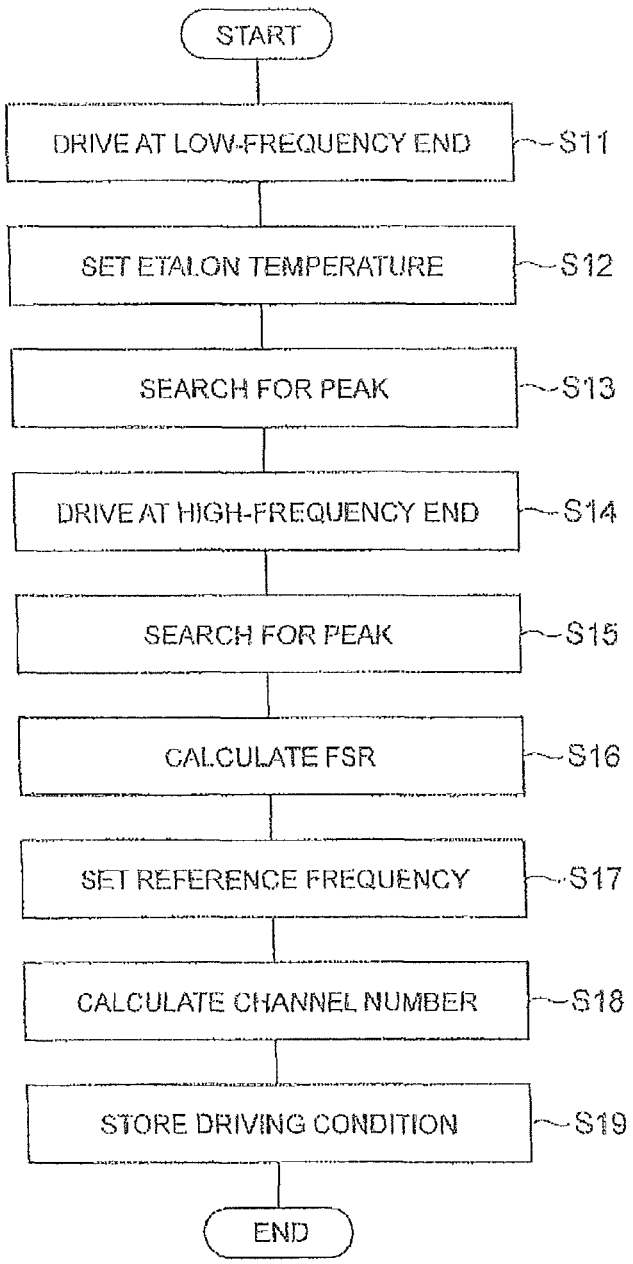

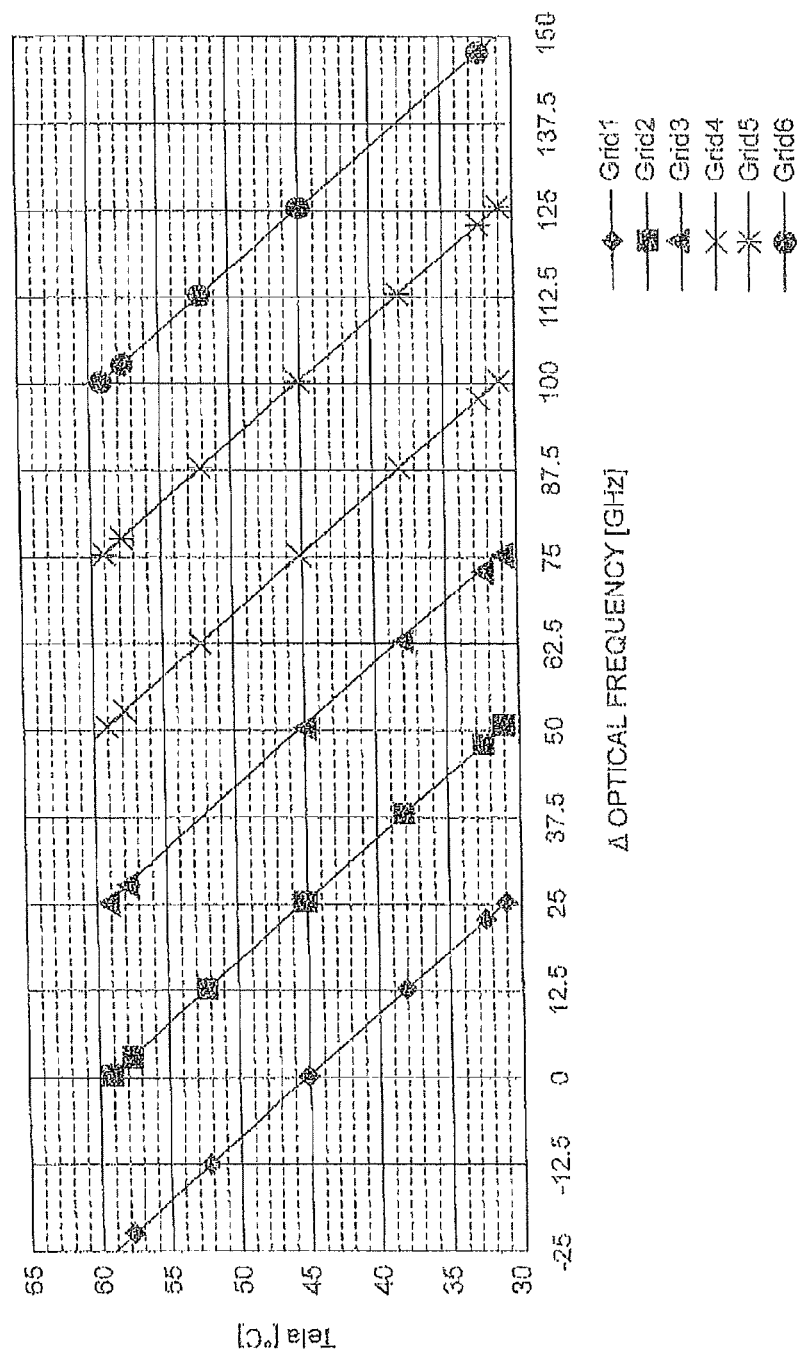

Fig. 10

| Ch | INITIAL SETTING VALUES | | | | | FEEDBACK CONTROL TARGET VALUES | | ETALON TEMPERATURE | TEMPERATURE CORRECTION COEFFICIENT |
|---|---|---|---|---|---|---|---|---|---|
| | LD TEMPERATURE [degC] | DFB [mA] | DBR1 [mW] | DBR2 [mW] | DBR3 [mW] | Im1 [μA] | Im2/Im1 A.U. | [degC] | C1 [GHz/°C] |
| 1 | a1 | b1 | c1 | d1 | e1 | f1 | g1 | 45.00 | -1.80 |
| 2 | a2 | b2 | c2 | d2 | e2 | f2 | g2 | | |
| 3 | a3 | b3 | c3 | d3 | e3 | f3 | g3 | | |
| ... | ... | ... | ... | ... | ... | ... | ... | | |
| n | an | bn | cn | dn | en | fn | gn | | |

METHOD FOR TESTING TUNABLE WAVELENGTH LASER DEVICE AND TUNABLE WAVELENGTH LASER DEVICE

The present invention relates to a method for testing a tunable wavelength laser device and a tunable wavelength laser device.

BACKGROUND OF THE INVENTION

A tunable wavelength laser having a selectable output wavelength is disclosed in Laid-open Japanese Patent Publication No. 2009-026996, for example.

SUMMARY OF THE INVENTION

In the case of the technology of Patent Literature (Laid-open Japanese Patent Publication No, 2009-026996), driving conditions for obtaining ITU-T grid wavelengths, for example, are stored in a memory. Based on the stored driving conditions, then, control is performed so that oscillation occurs at any of the ITU-T grid wavelengths. It is customary to make use of light transmission characteristics of an etalon as a wavelength locker for the purpose of controlling the output wavelength. The light transmission characteristics of an etalon, however, involve errors resulting from deviating components or assembly processes. Therefore, there is a need to correct the light transmission characteristics by means of temperature control. Particularly, in the case of gridless control, which performs control at a wavelength other than the grid wavelengths, the temperature range necessary for the error correction proportion increases.

Therefore, it is an aspect of the present invention to provide a method for testing a tunable wavelength laser device, which can suppress any error of light transmission characteristics of an etalon, and a rankle wavelength laser device.

A method for testing a tunable wavelength laser device according to an aspect of the present invention is a method for testing a tunable wavelength laser device including a tunable wavelength laser and a wavelength sensing unit having an etalon. The testing method includes a first step of measuring a free spectral range interval of the etalon; a second step of acquiring a driving condition by tuning a wavelength to a target value provided between a top and a bottom of the free spectral range interval; and a third step of storing the driving condition in a memory.

A method for testing a tunable wavelength laser device according to an aspect of the present invention can suppress any error of light transmission characteristics of an etalon and thereby reduce the range of temperature control.

BRIEF DESCRIPTION OF THE DRAWINGS

FIG. 5A is a diagram illustrating light transmission Characteristics of an colon at a low-frequency end of an ITU-T grid.

FIG. 5B is a diagram illustrating light transmission characteristics of an etalon at a high-frequency end of an ITU-T grid.

FIG. 6 is a diagram illustrating gridless control.

FIG. 7 is a flowchart illustrating details of a testing method.

FIG. 9 illustrates a frequency range of each channel when the temperature of the etalon is 45° C.

FIG. 10 is a diagram illustrating an exemplary driving condition of each channel stored in a memory.

DETAILED DESCRIPTION OF THE INVENTION

Figure 1:
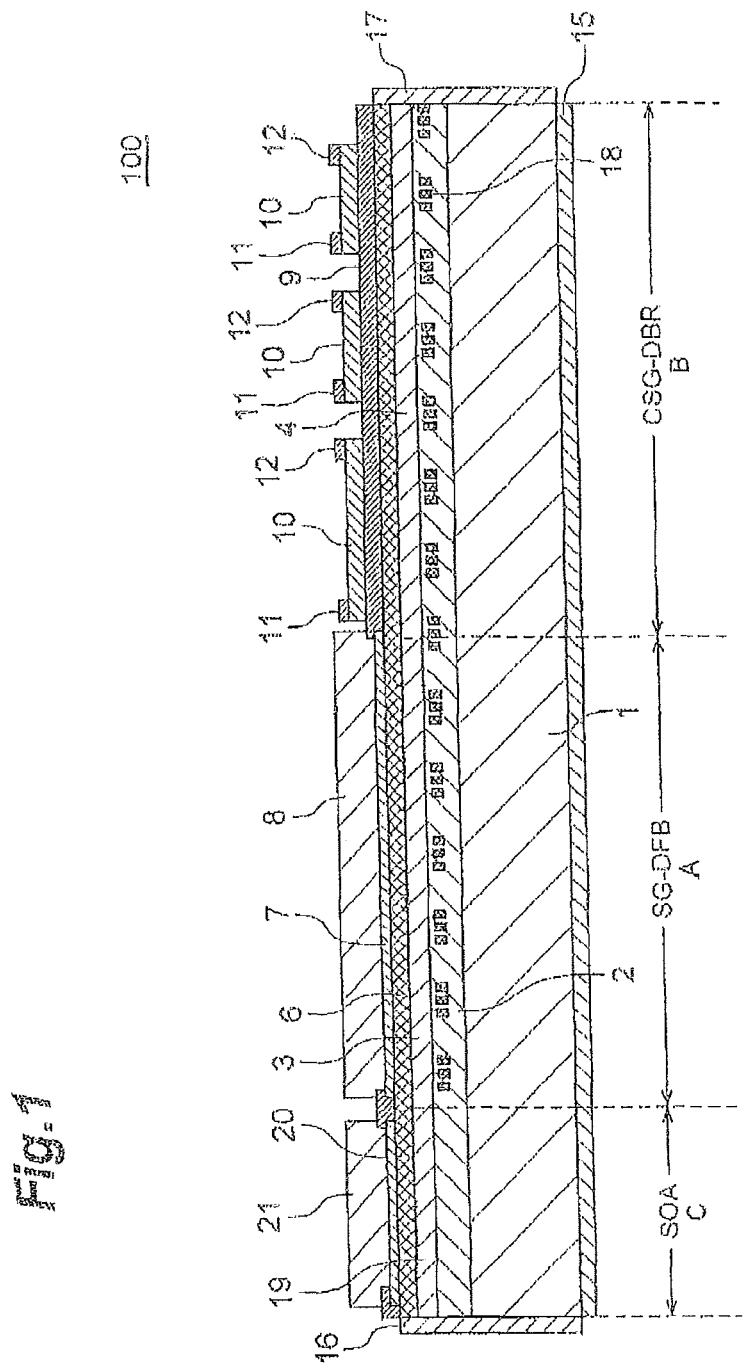
FIG. 1 is a block diagram illustrating an overall configuration of a semiconductor laser.

[Description of Embodiments of the Present Invention]

Firstly, contents of embodiments of the present invention will be enumerated and described.

According to an aspect of the present invention, there is provided (1) a method for testing a tunable wavelength laser device including a tunable wavelength laser and a wavelength sensing unit having an etalon, the method including: a first step of measuring a free spectral range interval of the etalon; a second step of acquiring a driving condition by tuning a wavelength to a target value provided between a top and a bottom of the free spectral range interval; and a third step of storing the driving condition in a memory. This configuration makes it possible to suppress the temperature control range of the etalon.

(2) The acquired driving condition may include a first driving condition, in which driving is performed at a predetermined value, and a second driving condition, which outputs a wavelength different from a wavelength outputted in the first driving condition, based on a sensing result of the wavelength sensing unit.

(3) The acquired driving condition may include, based on a sensing result of the wavelength sensing unit, a first driving condition and a second driving condition, which outputs a wavelength different from a wavelength outputted in the first driving condition.

(4) The driving condition may be a condition acquired for each integer multiple of the half of a free spectral range.

(5) The driving condition may be a driving condition in a position corresponding to 14 of a free spectral range.

(6) An output wavelength of the tunable wavelength laser in at least one of the first driving condition and the second driving condition may be different from an ITU-T grid.

According to another aspect of the present invention, there is provided (7) a tunable wavelength laser device including: a tunable wavelength laser; a wavelength sensing unit having an etalon; a memory storing a control data value composed of a grid interval and a reference frequency of the tunable wavelength laser; and a controller configured to control an output wavelength of the tunable wavelength laser in response to the control data value stored in the memory and a sensing result or the wavelength sensing unit, wherein the controller includes a computing unit configured to compute a required wavelength, which is obtained from a reference frequency, a grid interval, and a channel, which are inputted, from the reference frequency and the grid interval, which axe stored in the memory. This configuration makes it possible to suppress the temperature control range of the etalon.

According to another aspect of the present invention, there is provided (8) a method for testing a tunable wavelength laser device comprising a tunable wavelength laser and a wavelength sensing unit having an etalon, the method comprising: measuring a free spectral range interval of the etalon to be a fixed setting value; setting a reference frequency f0 being below a frequency f_Lo of the low-frequency end of the wavelength control range; acquiring a driving condition driving condition by tuning a wavelength based on a channel umber, the reference frequency f0 and the free spectral range; and storing the driving condition in a memory.

(9) The channel number may be calculated according to Equation such as f0+{FSR/2×(channel number−1)}FSR/4≥f_Hi, wherein. ID represented the reference frequency f0, FSR represented the free spectral range and f_Hi represented a high-frequency end of the wavelength control range.

(10) The acquired driving condition may comprise a East driving condition, in which driving is performed at a predetermined value, and a second driving condition, which outputs a wavelength different from a wavelength outputted in the first driving condition, based on a sensing result of the wavelength sensing unit.

(11) The acquired driving condition may comprise, based on a sensing result of the wavelength sensing unit, a first driving condition and a second driving condition, which outputs a wavelength different from a wavelength outputted in the first driving condition.

(12) The output wavelength of the tunable wavelength laser in at least one of the first driving condition and the second driving condition may be different from an ITU-T grid.

[Details of Embodiments of the Present Invention]

A method for testing a tunable wavelength laser device and a tunable wavelength laser device according to an embodiment of the present invention, as well as a specific example of control data of the tunable wavelength laser device, twill hereinafter be described with reference to the accompanying drawings. In addition, the present invention is not limited to such exemplary descriptions. It is intended to include, as disclosed in the claims, any meaning equivalent to the claims and all modifications falling within the claims.

FIG. 1 is a block diagram illustrating an overall configuration of a semiconductor laser 100, which con be used for a tunable wavelength laser device according to an embodiment of the present invention. The semiconductor laser 100 is a tunable wavelength laser. As illustrated in FIG. 1, the semiconductor laser 100 includes a SCI-DFB (Sampled Grating Distributed Feedback) area A, a CSG-DBR (Chirped Sampled Grating Distributed Bragg Reflector) area B, and a SOA (Semiconductor Optical Amplifier) area C. That is, the semiconductor laser 100 has a wavelength selection mirror inside the semiconductor structure.

As an example, the semiconductor laser 100 has, spanning from its front side to the rear side, a BOA area C, a SG-DFB area A, and a CSG-DBR area B arranged in this order. The SG-DFB area A has a gain and includes a sampled grating. The CSG-DBR area B has no gain and includes a sampled grating.

The SG-DFB area A has a lower clad layer 2, an active layer 3, an upper clad layer 6, a contact layer 7, and an electrode 8. The lower clad layer 2, the active layer 3, the upper clad layer 6, the contact layer 7, and the electrode 8 are stacked on a substrate 1. The CSG-DBR area B has a lower clad layer 2, an optical waveguide layer 4, an upper clad layer 6, an insulation film 9, and a plurality of beaters 10. The lower clad layer 2, the optical waveguide layer 4, the upper clad layer 6, the insulation film 9, and the plurality of heaters 10 are stacked on the substrate 1. Each heater 10 is provided with a power source electrode 11 and a ground electrode 12. The SOA area C has a lower clad layer 2, an optical amplification layer 19, an upper clad layer 6, a contact layer 20, and an electrode 21. The lower clad layer 2, the optical amplification layer 19, the upper clad layer 6, the contact layer 20, and the electrode 21 are stacked on the substrate 1.

In connection with the SG-DFB area A, the CSG-DBR, area B, and the SOA area C, the substrate 1, the lower clad layer 2, and the upper clad layer 6 are formed integrally. The active layer 3, the optical waveguide layer 4, and the optical amplification layer 19 are formed on the same surface. The boundary between the SG-DFB area A and the CSG-DBR area B corresponds to the boundary between the active layer 3 and the optical waveguide layer 4.

An end surface film 16 is formed on end surfaces of the substrate 1, the lower clad 2, the optical amplification layer 19, and the upper clad layer 6, which are adjacent to the SOA area C. The end surface film 16 is an AR (Anti-Reflection) film. The end surface film 16 is a front-side end surface of the semiconductor laser 100. An end surface film 17 is formed on end surfaces of the substrate, 1, the lower clad 2, the optical amplification layer 4, and the ripper clad layer 6, which are adjacent to the CSG-DBR area B. The end surface film 17 is an AR film. The end surface film 17 is a rear-side end surface of the semiconductor laser 100.

The substrate 1 is a crystal substrate made of n-type InP, for example. The lower clad layer 2 is composed of n-type InP, for example. The upper clad layer 6 is composed of p-type InP, for example. The lower clad layer 2 and the upper clad layer 6 optically confine the active layer 3, the optical waveguide layer 4, and the optical amplification layer 19 from below and above, respectively.

The active layer 3 is composed of a semiconductor having a gain. The active layer 3 has a quantum well structure, for example. The active layer 3 has well layers and barrier layers, for example. The well layers and the barrier layers are stacked alternately. The well layers are composed of $Ga_{0.32}In_{0.68}As_{0.92}P_{0.08}$ (thickness: 5 nm). The barrier layers are composed of $Ga_{0.32}In_{0.68}As_{0.47}P_{0.53}$ (thickness: 10 nm). The optical waveguide layer 4 can be composed of a bulk semiconductor layer, for example. The optical waveguide layer 4 is composed of $Ga_{0.22}In_{0.78}As_{0.47}P_{0.53}$, for example. The optical waveguide layer 4 has an energy gap larger than that of the active layer 3.

The optical amplification layer 19 is given a gain by current injection from the electrode 21. As a result, the optical amplification layer 19 conducts optical amplification. The optical amplification layer 19 has a quantum well structure, for example. The optical amplification layer 19 has well layers and bather layers. The well layers and the barrier layers are stacked alternately. The well layers are composed of $Ga_{0.35}In_{0.65}As_{0.99}P_{0.68}$ (thickness: 5 nm), for example. The barrier layers are composed of $Ga_{0.15}In_{0.85}As_{0.32}P_{0.68}$ (thickness: 10 nm), for example. As another structure, furthermore, it is also possible to employ a bulk semiconductor made of $Ga_{0.44}In_{0.56}As_{0.95}P_{0.05}$, for example. The optical amplification layer 19 and the active layer 3 can also be composed of the same material.

The contact layers 7, 20 can be composed of p-type $Ga_{0.47}In_{0.53}As$ crystals, for example. The insulation film 9 is a protection film. The protection film is composed of silicon nitride (SiN) or silicon oxide (SiO). The heaters 10 are thin-film resistors. The thin-film resistors are composed of titanium tungsten (TiW). Each of the heaters 10 may be formed across a plurality of segments of the CSG-DBR, area B.

The electrodes 8, 21, the power supply electrodes 11, and the ground electrodes 12 are composed of a conductive material, such as gold (Au). A back electrode 15 is formed beneath the substrate 1. The back electrode 15 is formed across the SG-DFB area A, the CSG-DBR area B, and the SOA area C.

The end surface film 16 and the end surface film 17 are AR films having a reflection ratio of 1.0% or less. The end surface 16 and the end sin-face film 17 have characteristics making their end surfaces substantially non-reflective. The AR films are composed of dielectric films. The dielectric films are composed of $MgF_2$ and TiON, for example. In addition, both ends of the laser are AR films. However, both ends of the laser may also have end surface films 17 composed of reflective films having a meaningful reflection ratio. In the case of a structure providing a light absorption layer on a semiconductor adjoining the end surface film 17 illustrated in FIG. 1, a meaningful reflection ratio of the end surface film 17 can suppress optical output leaking from the end surface film 17 to the outside. The meaningful reflection ratio, as used herein, refers to a reflection ratio of 10% or higher, for example. In addition, the reflection ratio in this connection refers to a reflection ratio with regard to the inside of the semiconductor laser.

Diffraction gratings (corrugation) 18 are formed in a plurality of positions at a predetermined interval on the lower clad layers 2 of the SG-DFB area A and the CSG-DBR area B. A sampled grating is formed in the SG-DFB area A and the CSG-DBR area B. The SG-DFB area A and the CSG-DBR area B are provided with a plurality of segments on the lower clad layers 2. Each segment, as used herein, refers to an area having one diffraction grating portion and a space portion positioned consecutively. Each diffraction grating portion is provided with a diffraction grating 18. Each space portion is provided with no diffraction grating 18. In other words, a segment refers to an area having a space portion, both ends of which are interposed between diffraction grating portions, and a diffraction grating portion connected to each other. The diffraction gratings 18 are composed of a material having a refractive index different from that of the lower clad layers 2. When the lower clad layers 2 are made of InP, the diffraction gratings are composed of $Ga_{0.22}In_{0.78}As_{0.47}P_{0.53}$, for example.

The diffraction gratings 18 are formed by patterning using a two-beam interference exposure method. The space portions are positioned between the diffraction gratings 18. The apace portions can be implemented by exposing patterns of the diffraction gratings 18 to light by means of a resist and then performing additional light exposure in positions that correspond to the space portions. The pitch of the diffraction gratings 18 in the SG-DFB area A and the pitch of the diffraction gratings 18 in the CSG-DBR area B may be identical. Furthermore, the pitch of the diffraction gratings 18 in the SG-DFB area A and the pitch of the diffraction gratings 18 in the CSG-DBR area B may be different. The tunable wavelength laser device 200 has, as an example, both pitches set to be identical. In connection, with respective segments, the diffraction gratings 18 may have the same length. Furthermore, the diffraction gratings 18 may have different lengths. Respective diffraction gratings 18 of the SG-DFB area A may have the same length. Respective diffraction gratings 18 of the CSG-DBR area B may have the same length. The length of the diffraction gratings 18 of the SG-DFB area A and the length of the diffraction gratings 18 of the CSG-DBR area B may be different from each other.

In the SG-DFB area A, respective segments have substantially the same optical path length. In the CSG-DBR area B, at least two segments have different optical path lengths. The peak-related intensity of wavelength characteristics of the CSG-DBR area B has wavelength dependency. The average optical path length of segments of the SG-DFB area. A and the average optical path length of segments of the CSG-DBR area B are different from each other. The segments inside the SG-DFB area A and the segments inside the CSG-DBR area B constitute a resonator in the semiconductor laser 100.

Inside each of the SG-DFB area A and the CSG-DBR area B, reflected light interferes with each other. The SG-DFB area A is provided with an active layer 3. Carrier injection into the SG-DFB area A generates a discrete gain spectrum. This spectrum has a wavelength interval having approximately uniform peak intensities in the CSG-DBR area B, a discrete reflection spectrum is generated. This spectrum has a wavelength interval having different peak intensities. The intervals of peak wavelengths of wavelength characteristics in the SG-DFB area. A and the CSG-DBR area B are different from each other. It is possible to select a wavelength, which meets the oscillation condition, by using the Vernier effect resulting from a combination of such wavelength characteristics.

Figure 2:
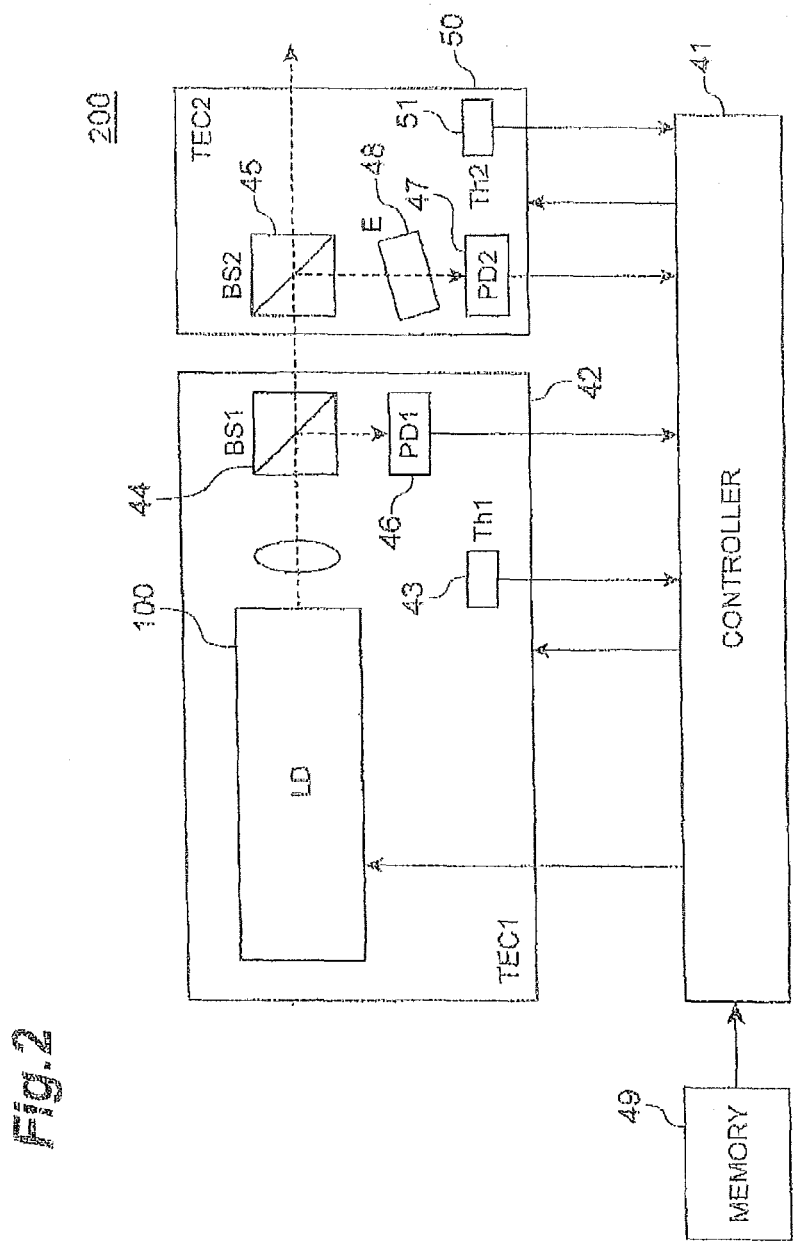
FIG. 2 is a diagram illustrating an overall system configuration of a tunable wavelength laser device according to a first embodiment.

FIG. 2 is a diagram illustrating an overall system configuration of a tunable wavelength laser device 200 according to the present embodiment. The tunable wavelength laser device 200 includes a controller 41, temperature control devices 42, 50, thermistors 43, 51, beam splitters 44, 45, light-receiving elements 46, 47, an etalon 48, a memory 49, and the like.

The controller 41 includes a CPU (Central Processing Unit), a RAM (Random Access Memory), a polder supply, and the like. The RAN is a memory configured to temporarily memorize 8 program executed by the CPU, data processed by the CPU, and the like. As the memory 49, a rewritable memory device can be used. The rewritable memory device may typically be a flash memory. The memory 49 has initial, setting values and feedback control target values of respective components of the semiconductor laser 100 memorized so as to correspond to respective channels. The channels, as used herein, refer to numbers corresponding to respective oscillation wavelengths of the semiconductor laser 100.

The temperature control device 42 is, for example, a device controlling the overall temperature of the semiconductor laser 100. The temperature control device 42 includes, for example, a Peltier element. The temperature control device 42 functions as a TEC (Thermoelectric cooler). The thermistor 43 is configured to indirectly detect the temperature of the semiconductor laser 100 by detecting the temperature of the temperature control device 42. The semiconductor laser 100, the thermistor 43, the beam splitter 44, and the light-receiving element 46 are arranged on the temperature control device 42. The temperature control device 50 is, for example, a device controlling the temperature of the etalon 48. The temperature control device 50 includes, for example, a Peltier element. The temperature control device 50 functions as a TEC. The thermistor 51 is configured to indirectly detect the temperature of the etalon 48 by detecting the temperature of the temperature control device 50. In addition, the beam splitter 45, the etalon 48, the light-receiving element 47, and the thermistor 51 are arranged on the temperature control device 50.

The controller 41 is configured to refer to the temperature of the thermistor 43 and to constantly maintain the temperature of the mounting surface of each component of the temperature control device 42. The controller 41 is configured to refer to the temperature of the thermistor 51 and to constantly maintain the temperature of the mounting surface of each component of the temperature control device 50. The controller 41, in this state, inputs control data to the semiconductor laser 100. The semiconductor laser 100 conducts laser oscillation at a wavelength based on the inputted control data. The temperature of the etalon 48 is controlled to be a temperature needed by the tunable wavelength laser device 200. In the case of implementing a desired operation by controlling the characteristics of the etalon 48, besides the control of maintaining a constant temperature, the temperature is allowed to change.

Output light from the semiconductor laser 100 is split by the beam splitter 44. One portion of the split light is incident on the light-receiving element 46. The other portion of the split light is additionally split by the beam splitter 45. One portion of the split light, which is obtained by splitting by the beam splitter 45, is incident on the light-receiving element 47 via the etalon 48. The other portion of the slit light, which is obtained by splitting by the beard splitter 45, is outputted to the outside. By means of the above configuration, the light-receiving element 46 measures the intensity of output light from the semiconductor laser 100. The light-receiving element 47 measures the intensity of transmitted light from the etalon 48. In addition the etalon 48 is an optical element having reflective mirrors, which have optical planes, arranged in parallel at a predetermined interval, or is an optical element having two semitransparent mirrors, which have optical planes, arranged in parallel at a predetermined interval.

The controller 41 controls the intensity of optical output of the semiconductor laser 100 based on the output of the light-receiving element 46. The controller 41 conducts a control for maintaining a designated wavelength (AFC control: Automatic Frequency Control) based on wavelength information.

Figure 3:
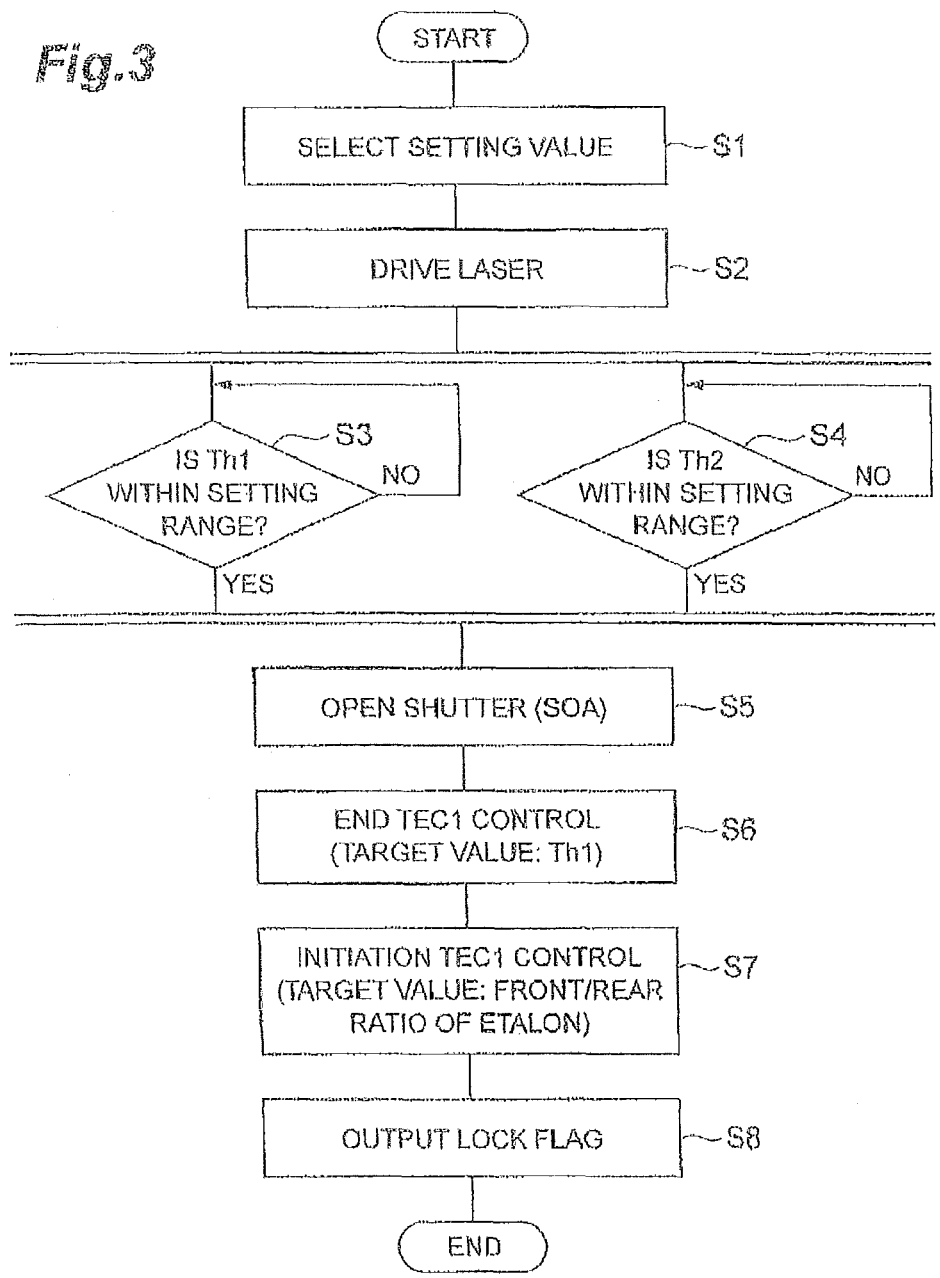
FIG. 3 is a diagram illustrating an exemplary flowchart of AFC control using a temperature control device.

FIG. 3 is a diagram illustrating an exemplary flowchart of AFC control using a temperature control device 42. As illustrated in FIG. 3, the controller 41 selects a setting value of the semiconductor, laser 100, which is stored in the memory 49, in response to a required wavelength (step S1). Next, the controller 41 drives the semiconductor laser 100 using the selected setting value (step S2).

The controller 41 determines whether the temperature Th1, which is detected by the thermistor 43, is within an, allowed range of setting values or not (step S3). When "No" is continued in step S3, step S3 is repeated. In tandem with step S3, the controller 41 determines whether the temperature 312, which is detected by the thermistor 43, is within an allowed range of setting values or not (step S4). When "No" is confirmed in step S4, step S4 is repeated.

When "Yes" is confirmed in both steps S3 and S4, the controller 41 opens the shutter (step S5). Next, the controller 41 ends the temperature, control (control for making temperature Th1 become the control target) of the temperature control device 42 (step S6). The controller 41 initiates AFC control by means of the temperature control device 42 (step S7). Specifically, the controller 41 initiates temperature control of the temperature control device 42 using a ratio of optical intensity, which is detected by the light-receiving element 46, and optical intensity detected by the light-receiving element 47, as the control target. This control may be either a method of giving a target value only or a method of giving an allowed range as a target value. As the ratio of optical intensifies becomes the target value or falls within the allowed range as a result of the control by the temperature control device 42, the controller 41 outputs a locker flag (step SB).

Figure 4:
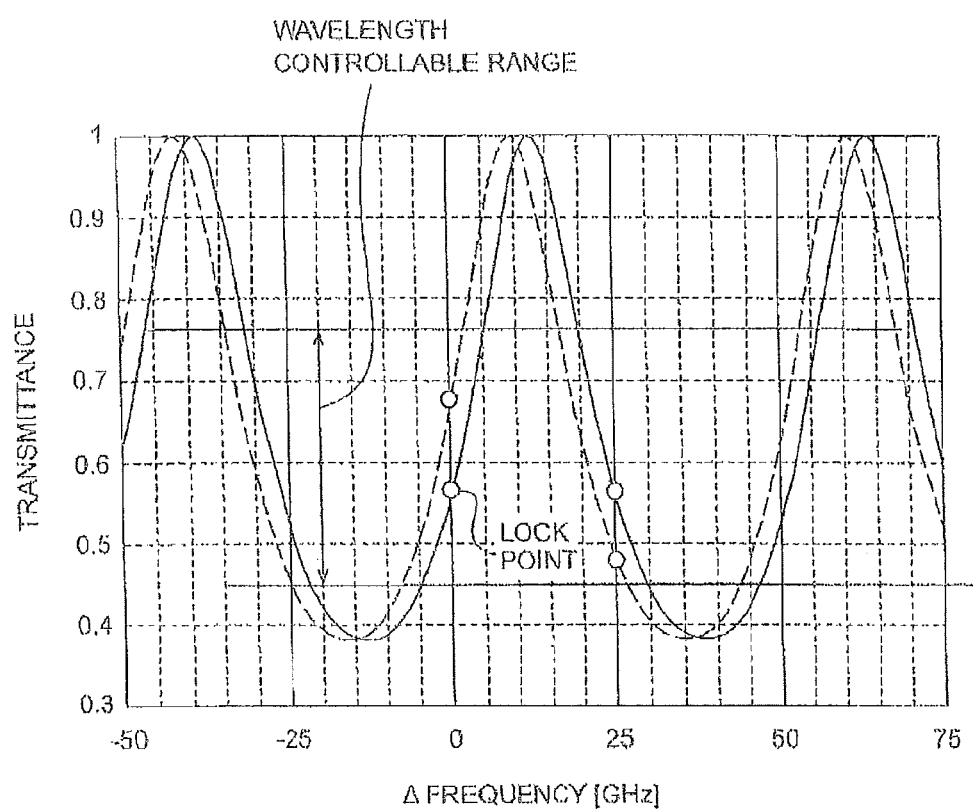
FIG. 4 is a diagram illustrating light transmission characteristics of an etalon.

Details of wavelength control using an etalon 48 will be described. FIG. 4 is a diagram illustrating light transmission characteristics of an etalon 48. As indicated by the solid line in FIG. 4, the etalon 48 has transmission characteristics that are periodic with respect to inputted optical frequencies. Therefore, it is possible to maintain optical frequencies in a stable state by measuring the optical intensity ratio between inputted light and transmitted light and controlling the optical intensity ratio to be constant. Transmission characteristics have slopes as shown in FIG. 4. A slope, as used herein, refers to an area having a positive or negative inclination between a peak and a bottom. A peak and a bottom, as used herein, refer to areas in which inclinations of slopes are overturned (signs of the inclinations change). It is difficult to stably use any value near the peaks and bottoms as a lock point. Therefore, it is preferred to use a range, in which slopes have comparatively large inclinations, as the wavelength controllable range.

In general, respective channels are set so as to correspond to grid wavelengths of (international Telecommunication Union Telecommunication Standardization Sector).

The etalon 48 has been designed to have characteristic periods based on an assumption of its use at specific frequencies regulated by the (e.g. 50 GHz, 25 HGz intervals of 191.6 THz-196.2 THz). That is, the etalon 48 has been designed so that half of its FSR (Free Spectral Range) becomes a grid interval of ITU-T. However, light transmission characteristics of the etalon 48 change based on deviation of characteristics of the etalon 48 itself, minor differences of inclination during mounting, etalon temperature, and the like. A lock point (feedback control target value) is commonly set to fall within a wavelength controllable range in connection with the entire channels of ITU-T grids. This setting is commonly made by a shift of slopes resulting from temperature adjustment by the etalon 48. For example, as indicated by the dotted line in FIG. 4, it is possible to shift light transmission characteristics of the etalon 48 in the frequency direction by means of temperature control by the etalon 48.

For example, in FIG. 4, when the frequency area in which wavelength control is impossible is about ±9 GHz, and the amount of frequency shift in response to a temperature change is −1.8 GHz/° C., correction of 9/1.8=5° C. is made. This correction makes it possible to include a lock point in any of left and right slope ranges having a peak or a bottom interposed between them. Meanwhile, it will be assumed that the etalon period has an error with respect to the ITU-T grid interval (25 GHz). In this case, there is a possibility that, even if the look point is adjusted to an end having a low frequency (e.g. 191 THz), the ITU-T grid will become a peak or a bottom of a slope dining a shill to an end having a high frequency. Therefore, in order to adjust the lock point to be within a wavelength controllable range, temperature correction of the etalon 48 needs to be made with respect to each channel.

Specifically, when the lock point is determined using a desired ITU-T grid, light transmission characteristics of the etalon 48 are shifted so that the lock point is in the Wavelength position of the corresponding ITU-T grid. This shift of light transmission characteristics is made by temperature adjustment of the etalon 48. Control data of the semiconductor laser 100 is adjusted so that such a lock point is implemented. Control data, which implements the corresponding lock point, is memorized in the memory 49. The grid interval is fixed at 25 GHz. Frequencies between adjacent grids are divided into halves. Which are assigned to respective grids.

FIG. 5A is a diagram illustrating light transmission characteristics of an etalon 48 at a low-frequency end of an ITU-T grid. It will be assumed that the temperature of the etalon 48 is constantly controlled at T0 (=45° C.). FIG. 5B is a diagram illustrating light transmission characteristics of the etalon 48 at a high-frequency end of ITU-T grid. As illustrated in FIG. 5A, adjustment of the lock point at the low-frequency end makes it possible to include the look point within a wavelength controllable range by a correction of ±5 C.°. If the low-frequency end is used as a reference to determine a lock point up to the high-frequency end while the temperature of the etalon 48 is maintained at T0, the error increases. The dotted line in FIG. 5B indicates light transmission characteristics to which an error, has occurred. In order to shift the erroneous light transmission characteristics to light transmission characteristics indicated by the solid line, a temperature correction of the etalon 48 is needed. The amount of necessary error correction is, for example, about 5° C. Therefore, a temperature correction of a total of ±10° C. is necessary.

Gridless control will now be described. The gridless control, as used herein, refers to a control that adjusts the oscillation wavelength of the semiconductor laser 100 to a wavelength between grid wavelengths. FIG. 6 is a diagram illustrating gridless control. As illustrated in FIG. 6, in the case of gridless control, a required wavelength is a wavelength between a grid wavelength and another grid wavelength adjacent to it.

In order to perform the gridless control; it is necessary to set the entire wavelengths between ITU-T grids. Therefore, it is necessary to control the temperature of the etalon 48 to be a temperature corresponding to a shift of ±12.5 GHz. Furthermore, there is a function that requires a wavelength shift, which is, referred to as fine tuning, as a specification of ITLA. Adding ±10 GHz resulting from the fine tuning, an optical frequency shift of ±22.5 GHz is necessary. The amount of shift of the temperature of the etalon 48 resulting from this is 22.5/1.8±12.5° C. Therefore, addition of the above-mentioned error correction amount of ±10 C.° and the error correction amount of ±12.5° C. for the gridless control indicates that the necessary temperature correction of the etalon 48 is 22.5° C. in total.

For example, when the design center value of temperature of the etalon 48 is 45° C., temperature control of the etalon 48 needs to be conducted in an extremely wide range of 22.5° C.-67.5° C. In this case, loads such as power consumption necessary for temperature control of the etalon 48 increase. In addition, an increase of error of the grid interval of the etalon 48 with respect to the ITU-T grid interval (25 GHz) requires temperature correction for a return. For example, the margin for such temperature correction is 5° C. However, an increased error leaves no margin. Furthermore, an increased error causes defective products and affects the yield.

Therefore, in connection with the tunable wavelength laser device 200, setting of control data is conducted using the etalon grid interval (FSR/2) of the etalon. 48, as well as the center value, as references. That is, in connection with the tunable wavelength laser device 200, setting of control data corresponding to the grid is not conducted. Specifically, the temperature of the etalon 48 is controlled constantly (e.g. 45° C.) In this state, lock points are determined with regard to respective slopes between peaks and bottoms. For example, a lock point is positioned at FSR/4 From a peak or from a bottom. Alternatively, a value of transmission ratio=0.55 can be used as the corresponding lock point. Control data of the semiconductor laser 100 for implementing respective lock points are memorized in the memory 49. The grid interval is set to be (25±α) GHz in conformity with the individual difference of each etalon. Frequencies between adjacent grids are divided into halves, which are assigned to respective grids. According to this technique, each lock point does not necessarily coincide with the ITU-T grid.

FIG. 7 is a flowchart illustrating details of a testing method regarding the tunable wavelength laser device 200. It will be assumed in the following description that the entire processing is performed by the controller 41. However, it is also possible that the user uses the controller 41 and performs partially manual processing. As illustrated in FIG. 7, the controller 41 sets control data of the semiconductor laser 100 so that the frequency f_Lo (e.g. 191.3 THz) of the low-frequency end of the wavelength control range (e.g. low-frequency end of ITU-T) is outputted (step S11). In this case, the controller 41 does not perform feedback control, and the like, of wavelengths using the etalon 48. Therefore, the output frequency of the semiconductor laser 100 does not need to coincide with the frequency f_Lo.

Figure 8A:
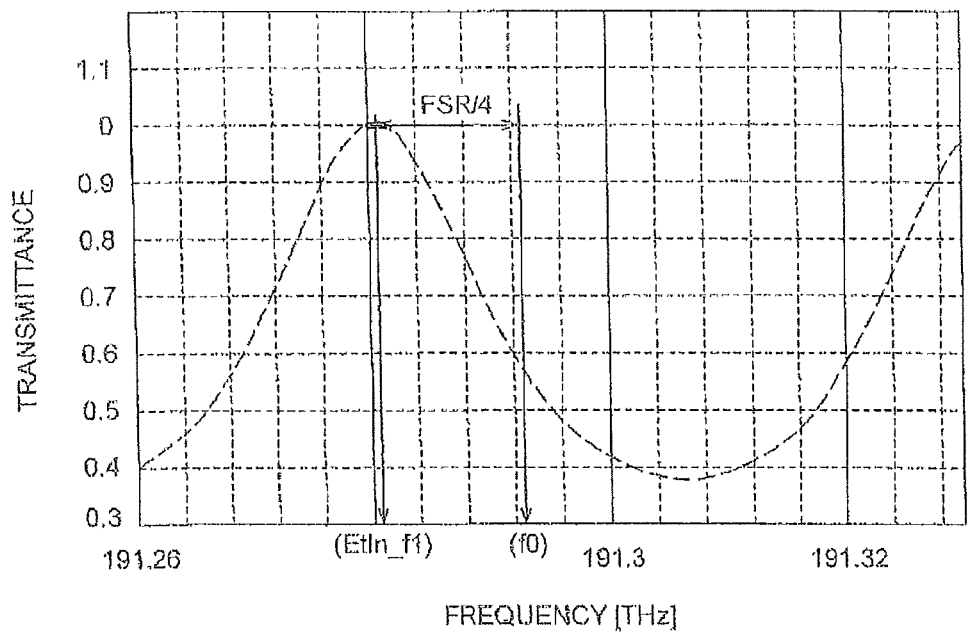
FIG. 8A is a diagram illustrating setting values.

Next, the controller 41 controls the temperature of the etalon 48 to be a fixed setting value (e.g. 45° C.) (step 312). Next, as illustrated in FIG. 8A, the controller 41 shifts the output frequency of the semiconductor laser 100 towards the low frequencies and, at the same time, searches for the closest peak Etln_f1 of the etalon 48 (step S13). This search is conducted by monitoring the detection result from the light-receiving element 47 or the ratio of detection result from the light-receiving element 46 and detection result from the light-receiving element 47.

Figure 8B:
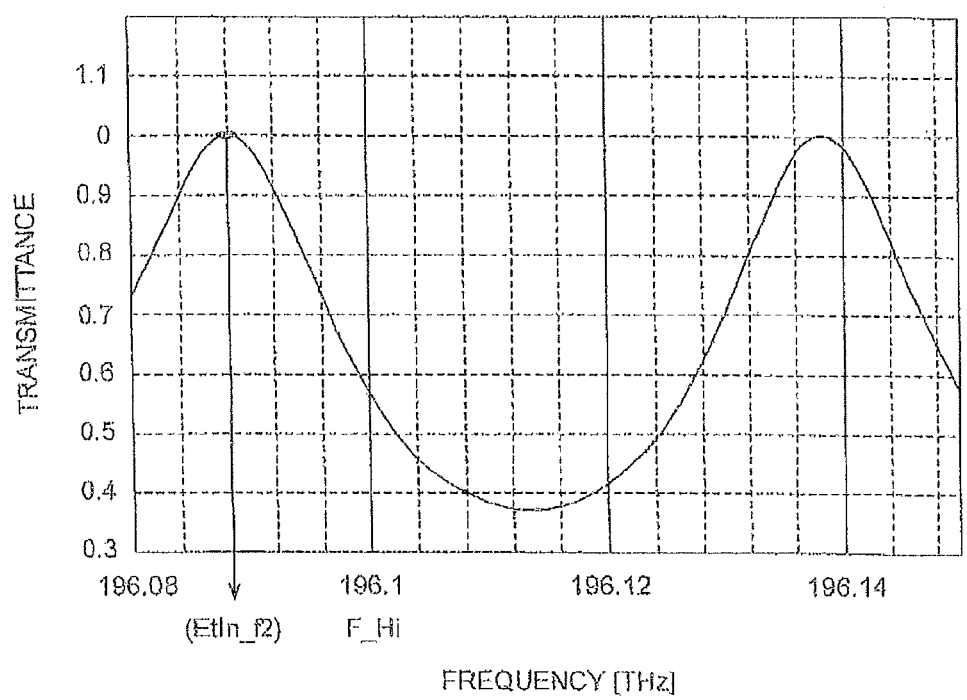
FIG. 8B is a diagram illustrating setting values.

Next, the controller 41 sets control data of the semiconductor laser 100 so that the frequency f_Hi (e.g. 196.11 THz) of the high-frequency end of the wavelength control range is outputted (step S14). In this case, furthermore, the controller 41 does not perform feedback control, and the like, of wavelengths using the etalon 48, so that the output frequency of the semiconductor laser 100 does not need to coincide with the frequency f_Hi. Next, as illustrated in FIG. 8B, the controller 41 shifts the output wavelength of the semiconductor laser 100 towards the low frequencies and, at the same time, searches for the peak Etln_f2 of the etalon 48 (step S15). This search is conducted by monitoring the detection result from the light-receiving element 47 or the ratio of detection result from the light-receiving element 46 and detection result from the light-receiving element 47, while shifting the output wavelength of the semiconductor laser 100 towards the low frequencies.

Next, the contoller 41 calculates the FSR of the etalon 48 according to Equations (1) and (2) below (step S16). The design etalon FSR is a design value of FSR of the etalon 48. The etalon FSR is the calculated. FSR of the etalon 48.

$$\text{Etalon peak number} = \{(\text{set channel number} \times \text{set channel interval})/\text{design etalon FSR}\} - 1 \quad (1)$$

$$\text{Etalon FSR} = |\text{Etln}\_f1 - \text{Etln}\_f2|/\text{etalon peak number} \quad (2)$$

Next, the controller 41 sets a reference frequency f0 (step S17). Specifically, the controller 41 calculates Etln_f1+FSR/4 or Etln_f1−FSR/4, as illustrated in FIG. 8A. Next, the controller 41 sets, as the reference frequency f0, one that is below frequency f_Lo. Next, the controller 41 calculates the actual channel number according to Equation (3) below (step S18).

$$f0+\{FSR/2\times(\text{channel number}-1)\}+FSR/4 \gtrsim f\_Hi \quad (3)$$

Next, the controller 41 adjusts the control data of the semiconductor laser 100 so that, ranging from channel one to channel n, fm (m=1−n (=charmed number))=f0+FSR/2 (n−1), and stores the driving condition in the memory 49 (step S19). Repetition until m reaches from one to n makes it possible to store the driving condition of each channel in the memory 49. Through the above-mentioned process, the method for testing a tunable wavelength laser device is completed.

Such channel setting makes it possible to suppress the temperature correction range of the etalon 48 to a range of about ±12.5° C., for example. The details will now be described. As illustrated in Table 1, for example, 45° C. is chosen, as the center temperature. A frequency range corresponding to one grid in connection with light transmission characteristics of the etalon 48 is ±12.5 GHz. When the temperature correction coefficient of the etalon 48 is C1=−1.8 GHz/° C., the setting temperature range for gridless control is ±12.5/1.8=±6.94° C. (≈7). Therefore, in Table 1, the minimum temperature concerning gridless control is 38° C., and the maximum temperature is 52° C. Next, it will be assumed that the frequency range of fine tuning is ±0.10 GHz, for example, and the maximum design value is ±12.50 GHz. In this case, the setting temperature range for fine tuning is ±5.55° C., and the maximum design value is ±6.94° C. FIG. 9 is a table illustrating a frequency range of each channel when the temperature of the etalon 48 is 45° C.

TABLE 1

| | |
|---|---|
| +FTF min(2) | 31° C. |
| +FTF min(1) | 32, 45° C. |
| grid min | 38° C. |
| CENTER TEMPERATURE | 45° C. |
| grid max | 52° C. |
| +FTF max(1) | 57, 55° C. |
| FTF max(2) | 59° C. |

FIG. 10 is a diagram illustrating an example of control data stored in a memory 49 by a testing method regarding a tunable wavelength laser device. The control data includes driving conditions of respective channels. The driving conditions include initial setting values and feedback control target values. As illustrated in FIG. 10, the initial setting values include an initial temperature value (LD temperature) of the semiconductor laser 30, an initial current value DUB, and initial power values DBR1-DBR3. The initial current value DFB is a current value supplied to the electrode 8 of the SG-DFB area A. The initial power values DBR1-DBR3 are power values supplied to respective heaters 10. These initial setting values are determined with respect to respective channels. The feedback control target values are target values when, performing feedback control of the controller 41. The feedback control target values include target value $I_{m1}$ and target value $I_{m2}/I_{m1}$. The target value $I_{m1}$ is a target value of a photocurrent outputted by the light-receiving element 46. The target value $I_{m2}/I_{m1}$ is a target value of a ratio of a photocurrent $I_{m2}$ outputted by the light-receiving element 47 with regard to a photocurrent $I_{m1}$ outputted by the light-receiving element 46. The control target values are determined with respect to respective channels. The memory 49 stores the temperature of the etalon 48 and a temperature correction coefficient C1. The temperature correction coefficient C1 is frequency variation amount/temperature change amount [GHz/° C.] of the etalon 48.

Figure 11:
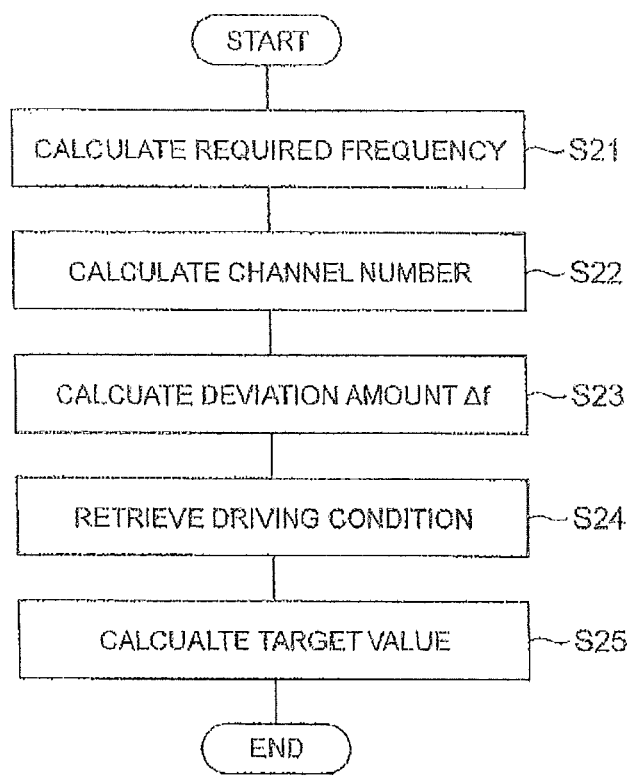
FIG. 11 is a flowchart of a calculation for implementing a required frequency using obtained initial setting values.

Subsequently, a calculation method for implementing a required frequency using an obtained initial setting value will be described. FIG. 11 is an exemplary flowchart of this case. First, the controller 41 calculates a required frequency f according to Equation (4) below (step S21). The required frequency f is calculated from an inputted channel number CHNo, a reference frequency f11, a grid interval Grid, and the like.

$$f=f0+(\text{CHNo}-1)\times\text{Grid} \quad (4)$$

Next, the controller 41 calculates the channel number CHNo_mem of FIG. 10 according to Equation (5) below (step S22). The channel number CHNo_mem is calculated from a reference frequency f0_mem and a grid interval Grid_mem of the etalon 48 when composing the data of FIG. 10. In addition, decimal numbers are rounded off.

$$\text{CHN0\_mem}=((f+\text{Grid\_mem}/2)-f0\_\text{mem})\text{Grid\_mem} \quad (5)$$

Next, the controller 41 calculates the amount of deviation Δf from the frequency of channel number CHNo_mem of FIG. 10 according to Equation (6) below (step S23). Next, the controller 41 retrieves the driving condition of the channel of CHNo_mem from data of FIG. 10 (step S24).

$$\Delta f=f\{(f0\_\text{mem}+(\text{CHNo\_mem}-1)\times\text{Grid}\} \quad (6)$$

Next, the controller 41 calculates a feedback control target value HT according to Equation (7) below (step S25). In Equation (7) below, HT0 is a feedback control target value of the channel of CHNo_mem. And "Slope" refers to the inclination of a slope of light transmission characteristics of the etalon 42. When performing fine tuning, the controller 41 changes the temperature Teta of the etalon according to Equation (8) below. In Equation (8) below, Teta0 is an etalon temperature Tetalon of the channel of CHNo_mem. And IF is the amount of variation of the frequency, which is varied by fine tuning.

$$HT=HT0+\text{Slope}\times\Delta f \quad (7)$$

$$\text{Teta}=\text{Teta0}+\text{Slope}\times(\Delta f\pm FTF) \quad (8)$$

According to the method for testing a tunable wavelength laser device, it is unnecessary to set the driving condition of a channel corresponding to a predetermined ITU-T grid. Therefore, it is possible to set the driving condition of each channel while the etalon temperature is maintained constantly. In this case, a correction temperature range, which is needed to change the etalon temperature, becomes unnecessary. This makes it possible to suppress the etalon temperature control range. The temperature control range becomes narrow. Therefore, power consumption of the temperature control device decreases. The etalon grid interval (FSR/2) is used as a channel reference. Therefore, even if the corresponding etalon grid interval is different from the interval of the ITU-T grid, there is no influence on the yield, hi connection with a slope of light transmission characteristics of the etalon, a lock point can be set as desired. Therefore, it is possible to determine a lock point in an optimal position (e.g. in a position of FSR/4 from a peak or from a bottom). This makes it Possible to guarantee a maximum value of the AFC-encompassing range, thereby improving precision of AFC.

In connection with the method for testing a tunable wavelength laser device, the driving condition of the channel of CHNo_mem is based on a measured reference frequency, a grid interval, and a channel. However, in reality, a reference frequency and a grid interval, which are inputted to the laser device to drive the laser, are difference from the measured reference frequency and grid interval in some cases. In such a case, the reference frequency, grid interval, and channel, which are actually inputted to the laser device, are converted into the measured reference frequency, grid interval, and channel and then read again. Specifically, it will be assumed that the reference frequency (f0_mem) inputted to the laser device is 191.0000 [THz], the grid interval (Grid_mem) is 50.0 [GHz], and the channel (CHNo_mem) is CH2. Then, the required frequency (f) is 191.1000 [Thz]. On the other hand, it will be assumed that the measured reference frequency (f0_mem) is 191.0300 [THz], and the grid interval (Grid_mem) is 49.0 [GHz]. The channel (CHNo_mem) is CH2. Then, the required frequency (1) is 191.0790 [Thz]. The wavelength difference ΔF between the basic wavelength of channel CH2 set from measurement and the required wavelength is 21 [GHz]. The driving condition of the laser device can be obtained through computation by means of gridless control of FIG. 6 from the wavelength difference ΔF. The present embodiment, although not illustrated, includes a computing unit configured to compute a required wavelength obtained from a reference frequency, a grid interval, and a channel, which are inputted to the laser device, from a reference frequency, a grid interval, and a charnel, which have been measured.

Although an embodiment of the present invention has been described in detail above, the present invention is not limited to any specific embodiment related thereto, but various changes and modifications can be made within the scope of the gist of the present invention as described in the accompanying claims.

What is claimed is:

1. A method for testing a tunable wavelength laser device comprising a tunable wavelength laser and a wavelength sensing unit having an etalon, the method comprising:

while setting an etalon temperature as corresponding to a design center value, obtaining an optical frequency at which light transmission characteristics reach a maximum for both a low-frequency end and a high-frequency end relating to a free spectral range interval of the etalon;

calculating the free spectral range interval of the etalon based on the optical frequency at which light transmission characteristics reach the maximum for both the low-frequency end and the high-frequency end;

acquiring a driving condition by tuning a wavelength to a target value provided between a top and a bottom of the free spectral range interval; and storing the driving condition in a memory.

2. The method according to claim 1, wherein the acquired driving condition comprises a first driving condition, in which driving is performed at a predetermined value, and a second driving condition, which outputs a wavelength different from a wavelength outputted in the first driving condition, based on a sensing result of the wavelength sensing unit.

3. The method according to claim 1, wherein the acquired driving condition comprises, based on a sensing result of the wavelength sensing unit, a first driving condition and a second driving condition, which outputs a wavelength different from a wavelength outputted in the first driving condition.

4. The method according to claim 1, wherein the driving condition is a condition acquired for each integer multiple of a half of a free spectral range.

5. The method according to claim 1, wherein the driving condition is a driving condition in a position corresponding to ¼ of a free spectral range.

6. The method according to claim 2, wherein an output wavelength of the tunable wavelength laser in at least one of the first driving condition and the second driving condition is different from an ITU-T grid.

7. The method according to claim 3, wherein an output wavelength of the tunable wavelength laser in at least one of the first driving condition and the second driving condition is different from an ITU-T grid.

* * * * *